United States Patent
Beyhs et al.

(10) Patent No.: US 11,397,466 B2
(45) Date of Patent: Jul. 26, 2022

(54) SKIN-TO-SKIN CONTACT DETECTION

(71) Applicant: Apple Inc., Cupertino, CA (US)

(72) Inventors: Michael J. Beyhs, Campbell, CA (US); Scott Peter Krueger, San Francisco, CA (US); Wesley William Zuber, Mountain View, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/836,552

(22) Filed: Mar. 31, 2020

(65) Prior Publication Data

US 2021/0303068 A1   Sep. 30, 2021

(51) Int. Cl.
*G06F 3/01* (2006.01)
*H03K 17/955* (2006.01)
*G06F 3/044* (2006.01)

(52) U.S. Cl.
CPC .............. *G06F 3/014* (2013.01); *G06F 3/017* (2013.01); *G06F 3/044* (2013.01); *H03K 17/955* (2013.01)

(58) Field of Classification Search
CPC ........ G06F 3/014; G06F 3/017; H03K 17/955
See application file for complete search history.

(56) References Cited

U.S. PATENT DOCUMENTS

| | | | |
|---|---|---|---|
| 8,378,967 B2 | 2/2013 | Noda et al. | |
| 9,552,069 B2 | 1/2017 | Gilad-Bachrach et al. | |
| 9,582,076 B2 | 2/2017 | Kienzle et al. | |
| 10,296,085 B2 | 5/2019 | Hamm | |
| 10,444,834 B2 | 10/2019 | Vescovi et al. | |
| 2009/0327171 A1* | 12/2009 | Tan | G06N 20/00 706/12 |
| 2011/0007035 A1 | 1/2011 | Shai | |
| 2011/0187637 A1 | 8/2011 | Nichols | |
| 2014/0198944 A1* | 7/2014 | Forutanpour | G06F 3/011 382/103 |
| 2015/0002475 A1* | 1/2015 | Tiao | G06F 3/017 345/175 |

(Continued)

FOREIGN PATENT DOCUMENTS

| | | |
|---|---|---|
| IN | 202017003945 A | 3/2020 |
| WO | 2017/215375 A1 | 12/2017 |

OTHER PUBLICATIONS

Zhang et al., "Skin Track: Using the Body as an Electrical Waveguide for Continuous Finger Tracking on the Skin," ACM, CHI 2016, 13 pages. (Year: 2016).*

(Continued)

*Primary Examiner* — Eric J. Bycer
(74) *Attorney, Agent, or Firm* — Kubota & Basol LLP

(57) ABSTRACT

Contact or movement gestures between a first body part and a second body part can be detected. Sense circuitry can be configured to sense a signal at the sense electrode (e.g., configured to contact the second body part) in response to a drive signal applied to the drive electrode (e.g., configured to contact the first body part). Processing circuitry can be configured to detect contact in accordance with a determination that one or more criteria are met (e.g., an amplitude criterion and a non-distortion criterion). Additionally or alternatively, processing circuitry can be configured to detect a movement gesture in accordance with a determination that one or more criteria are met (e.g., a contact criterion and a movement criterion).

22 Claims, 9 Drawing Sheets

(56) References Cited

U.S. PATENT DOCUMENTS

| | | | |
|---|---|---|---|
| 2015/0106706 A1* | 4/2015 | Jeong | G06F 3/04842 |
| | | | 715/274 |
| 2015/0160731 A1* | 6/2015 | Yun | H04L 67/025 |
| | | | 715/740 |
| 2015/0293161 A1* | 10/2015 | Lo | G06F 3/0441 |
| | | | 345/174 |
| 2015/0309582 A1* | 10/2015 | Gupta | G06F 3/017 |
| | | | 345/156 |
| 2016/0187974 A1* | 6/2016 | Mallinson | A63F 13/5255 |
| | | | 463/32 |
| 2016/0357265 A1* | 12/2016 | Maani | G06F 1/1686 |
| 2017/0090583 A1* | 3/2017 | Zamora Esquivel | G06F 3/014 |
| 2017/0090599 A1 | 3/2017 | Kuboyama et al. | |
| 2017/0123487 A1* | 5/2017 | Hazra | G06F 3/0346 |
| 2018/0236217 A1 | 8/2018 | Hamner et al. | |
| 2018/0267653 A1 | 9/2018 | Holman et al. | |
| 2019/0101981 A1 | 4/2019 | Elias et al. | |
| 2021/0303069 A1 | 9/2021 | Beyhs | |

OTHER PUBLICATIONS

Wang et al., "BodyRC: Exploring Interaction Modalities Using Human Body as Lossy Signal Transmission Medium," 2014 IEEE 11th Int'l Conf on Ubiquitous Intelligence & Computing, 8 pages (Year: 2014).*

Harrison et al., "Skinput: Appropriating the Body as an Input Surface," ACM, CHI 2010, 10 pages (Year: 2010).*

Harrison et al., "OmniTouch: Wearable Multitouch Interaction Everywhere," AMB UIST 2011, 10 pages (Year: 2011).*

Harrison et al., "On-Body Interaction: Armed and Dangerous," ACM TEI 2012, 8 pages (Year: 2012).*

Zhang et al., "Advancing Hand Gesture Recognition with High Resolution Electrical Impedance Tomography," ACM, UIST 2016, 8 pages (Year: 2016).*

Sato et al., "Touche: Enhancing Touch Interaction on Humans, Screens, Liquids, and Everyday Objects", 2012, 10 pages.

Zhang et al., "ActiTouch: Robust Touch Detection for On-Skin AR/VR Interfaces", 2019, 9 pages.

* cited by examiner

SKIN-TO-SKIN CONTACT DETECTION

FIELD

This relates generally to systems and methods of detecting skin-to-skin contact, and more particularly, to detecting contact between two hands or between two fingers for input in virtual reality or augmented reality environments.

BACKGROUND

Many types of input devices are presently available for performing operations in a computing system, such as buttons or keys, mice, trackballs, joysticks, touch sensor panels, touch screens and the like. In some examples, contact between two different parts of a user's body may be used for input. For example, cameras in a head-mounted display can be used to track movement of fingers to detect a finger in contact with an opposite hand, or to track movement of a finger along an opposite hand surface. Additionally or alternatively, a radiofrequency-based system can be used to detect a finger in contact with an opposite hand, or to track movement of a finger along an opposite hand surface. However, camera-based systems and/or radiofrequency-based systems may have difficulty detecting the difference between a finger touching the opposite hand or proximate to without contacting (hovering above) the opposite hand. Additionally, camera-based systems require the finger and opposite hand be in the field of view of the cameras for operation.

SUMMARY

This relates to devices and methods of detecting contact between a first body part and a second body part. Sense circuitry can be configured to sense a signal at the sense electrode (e.g., configured to contact the second body part) in response to a drive signal applied to the drive electrode (e.g., configured to contact the first body part). Processing circuitry can be configured to detect contact in accordance with a determination that one or more criteria are met. The one or more criteria can include a first criterion that is met when an amplitude of the sensed signal exceeds an amplitude threshold and a second criterion that is met when the sensed signal has a non-distorted waveform. Using a robust set of criteria, including an evaluation of the quality of the waveform (e.g., whether it is distorted or not), can improve the disambiguation between a skin-to-skin contact event and a proximity event.

This also relates to devices and methods of detecting a movement gesture using contact between two fingers of the same hand (e.g., to enable one-handed skin-to-skin input gestures). Sense circuitry can be configured to sense a signal at a sense electrode (e.g., configured to contact a finger of a hand) in response to a drive signal applied to a drive electrode (e.g., configured to contact a different finger of the hand). Processing circuitry can be configured to detect a movement gesture (e.g., a slide gesture) in accordance with a determination that one or more criteria are met. The one or more criteria can include a first criterion indicative of contact between a first finger and a second finger and a second criterion indicative of movement of the first finger along the second finger.

DETAILED DESCRIPTION

In the following description of examples, reference is made to the accompanying drawings which form a part hereof, and in which it is shown by way of illustration specific examples that can be practiced. It is to be understood that other examples can be used and structural changes can be made without departing from the scope of the disclosed examples.

This relates to devices and methods of detecting contact between a first body part and a second body part. Sense circuitry can be configured to sense a signal at the sense electrode (e.g., configured to contact the second body part) in response to a drive signal applied to the drive electrode (e.g., configured to contact the first body part). Processing circuitry can be configured to detect contact in accordance with a determination that one or more criteria are met. The one or more criteria can include a first criterion that is met when an amplitude of the sensed signal exceeds an amplitude threshold and a second criterion that is met when the sensed signal has a non-distorted waveform. Using a robust set of criteria, including an evaluation of the quality of the waveform (e.g., whether it is distorted or not), can improve the disambiguation between a skin-to-skin contact event and a proximity event.

This also relates to devices and methods of detecting a movement gesture using contact between two fingers of the same hand (e.g., to enable one-handed skin-to-skin input gestures). Sense circuitry can be configured to sense a signal at a sense electrode (e.g., configured to contact a finger of a hand) in response to a drive signal applied to a drive electrode (e.g., configured to contact a different finger of the hand). Processing circuitry can be configured to detect a movement gesture (e.g., a slide gesture) in accordance with a determination that one or more criteria are met. The one or more criteria can include a first criterion indicative of contact between a first finger and a second finger and a second criterion indicative of movement of the first finger along the second finger.

Figure 1A:
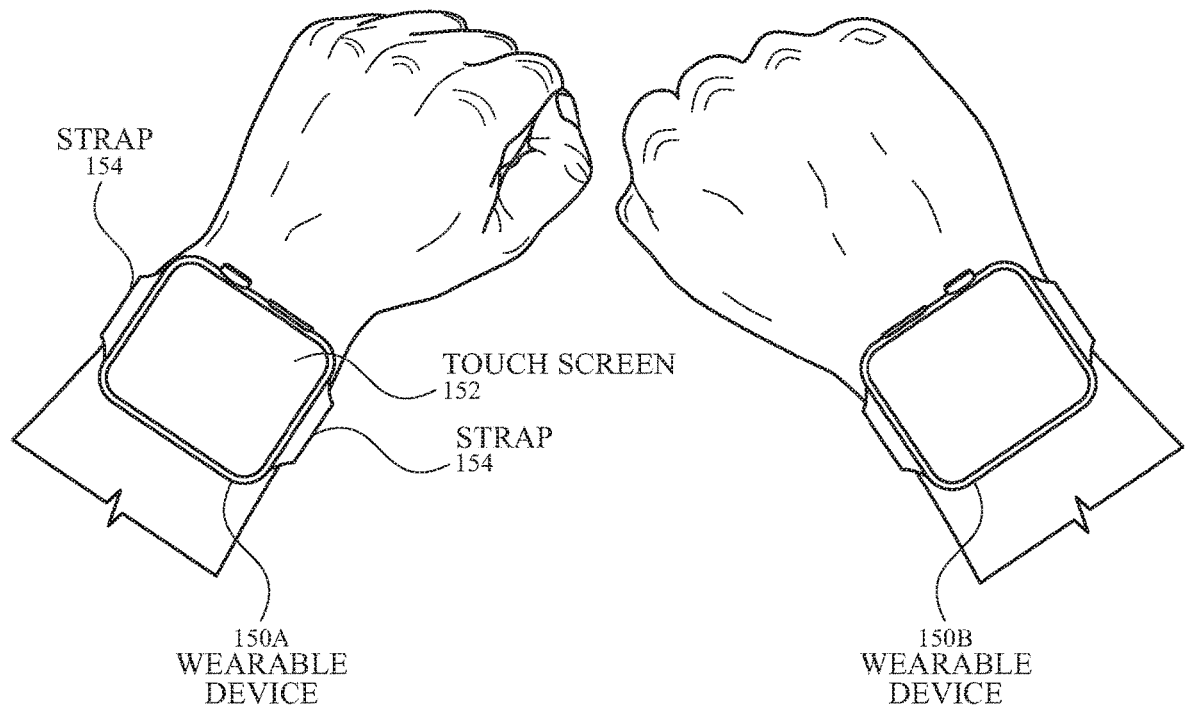
FIGS. 1A-1B illustrate an example system for skin-to-skin contact detection according to examples of the disclosure.
Figure 1B:
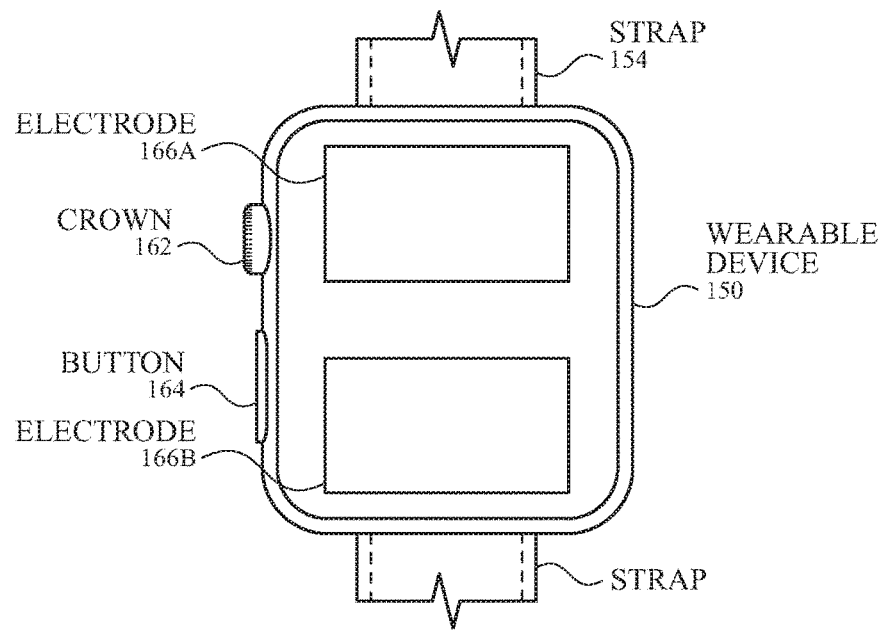

FIGS. 1A-1B illustrate an example system for skin-to-skin contact detection according to examples of the disclosure. FIG. 1A illustrates a system including two wrist-worn wearable devices 150A, 150B, each including at least one electrode to establish electrical contact between the wearable device and the wearer's skin. An electrode of a first wearable device 150A can be used to drive a drive signal (sometimes referred to as a "stimulation signal") into the wearer's body via the electrode's contact with the wrist of right hand 104A. An electrode of a second wearable device 150B can be used to sense a signal (sometimes referred to as a "sensed signal" or "received signal") from the wearer's body via contact with the wrist of left hand 104B. As described herein, without contact between hands 104A-104B, a conductive path through the body can allow for propagation of the drive signal and reception of the sensed signal. Proximity or contact between hands 104A-104B can form a second conductive path through the contact or proximity for propagation of the drive signal and reception of the sensed signal that can change characteristics of the sensed signal. These characteristics can be monitored and analyzed (e.g., by processing circuitry) and used to determine whether skin-to-skin contact has been made as discussed in more detail herein.

Figure 7A:
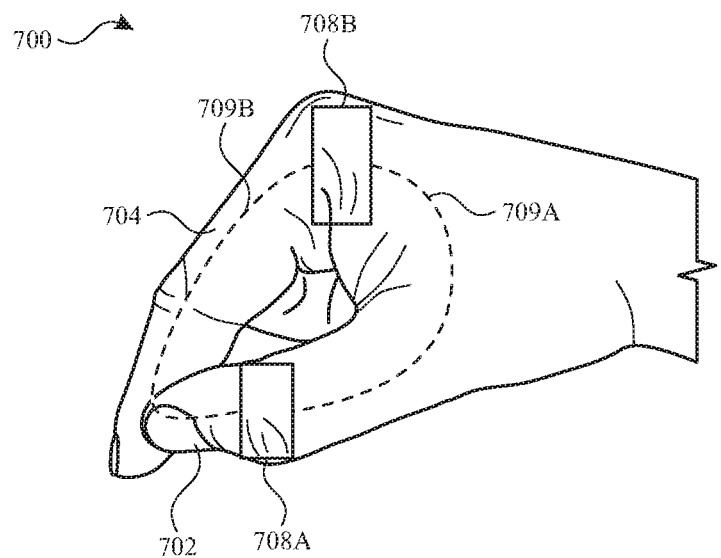
FIGS. 7A-7B illustrate an example system for detection of a skin-to-skin gesture according to examples of the disclosure.
Figure 7B:
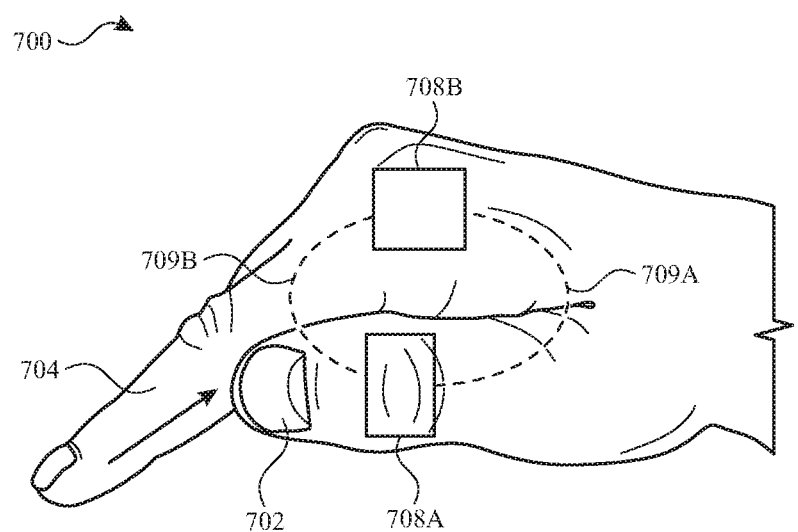

In some examples, as illustrated in FIG. 1A, the wearable devices 150A-105B can be watches (optionally including crown 162 and/or button 164) that can each be fastened to a user via strap 154 or any other suitable fastener. One or both of the wearable devices 150A-105B can include a touch screen 152. It is understood that although wearable devices 150A-150B are illustrated as including a touch screen 152, that the skin-to-skin contact detection can be achieved without a touch screen or display integrated with wearable devices 150A-150B. Additionally or alternatively, each wearable device can include processing circuitry, drive circuitry sense circuitry, and/or more than one electrode (e.g., to enable the various drive, sense and processing functionalities to be performed by either or both wearable devices). For example, FIG. 1B illustrates a backside of wearable device 150 with two electrodes 166A-B, though fewer or more electrodes is possible. For example, some devices device can include a single electrode (for single-ended driving and/or sensing capability), two electrodes (e.g., for single-ended driving or sensing and/or for differential driving or sensing), three electrodes (e.g., for single-ended driving and differential sensing and/or for differential driving and single-ended sensing) or four electrodes (e.g., for differential driving and/or differential sensing), etc. It should be understood that each of the watches can include all of the components above, or that the watches may include fewer components or different components. It should be understood that although watches are illustrated in FIGS. 1A-1B that different devices are possible and/or different placement of the devices is possible. For example, watches 150A-150B can be replaced with two wristbands; one wristband can include an electrode and drive circuitry and one wristband can include an electrode and sense circuitry. The control of the drive and sense circuitry and/or the processing of the signals received by the sense circuitry can be performed by circuitry within each respective wristband or by circuitry within another device (e.g., a smartphone or other computing device) based on wired or wireless communication between such a device and the wristbands. In some examples, one watch may be used for sensing and processing the sensed signal, and the drive circuitry and electrode can be implemented in another type of device (e.g., a ring). In some examples, one or both devices (e.g., for driving the drive signal and/or sensing the sensed signal) can be implemented in a glove, finger cuff, bracelet, necklace, head-mounted device, necklace, armband, headphones or ear buds. Although primarily described as wearable devices, in some examples, one or both devices can be a non-wearable device such as a handheld controller. Additionally, although primarily described as being implemented in two devices on two hands, it is understood that in some examples that two devices can be implement on one hand (e.g., as illustrated in FIGS. 7A-7B), and optionally integrated together in one device (e.g., in a glove).

Figure 2:
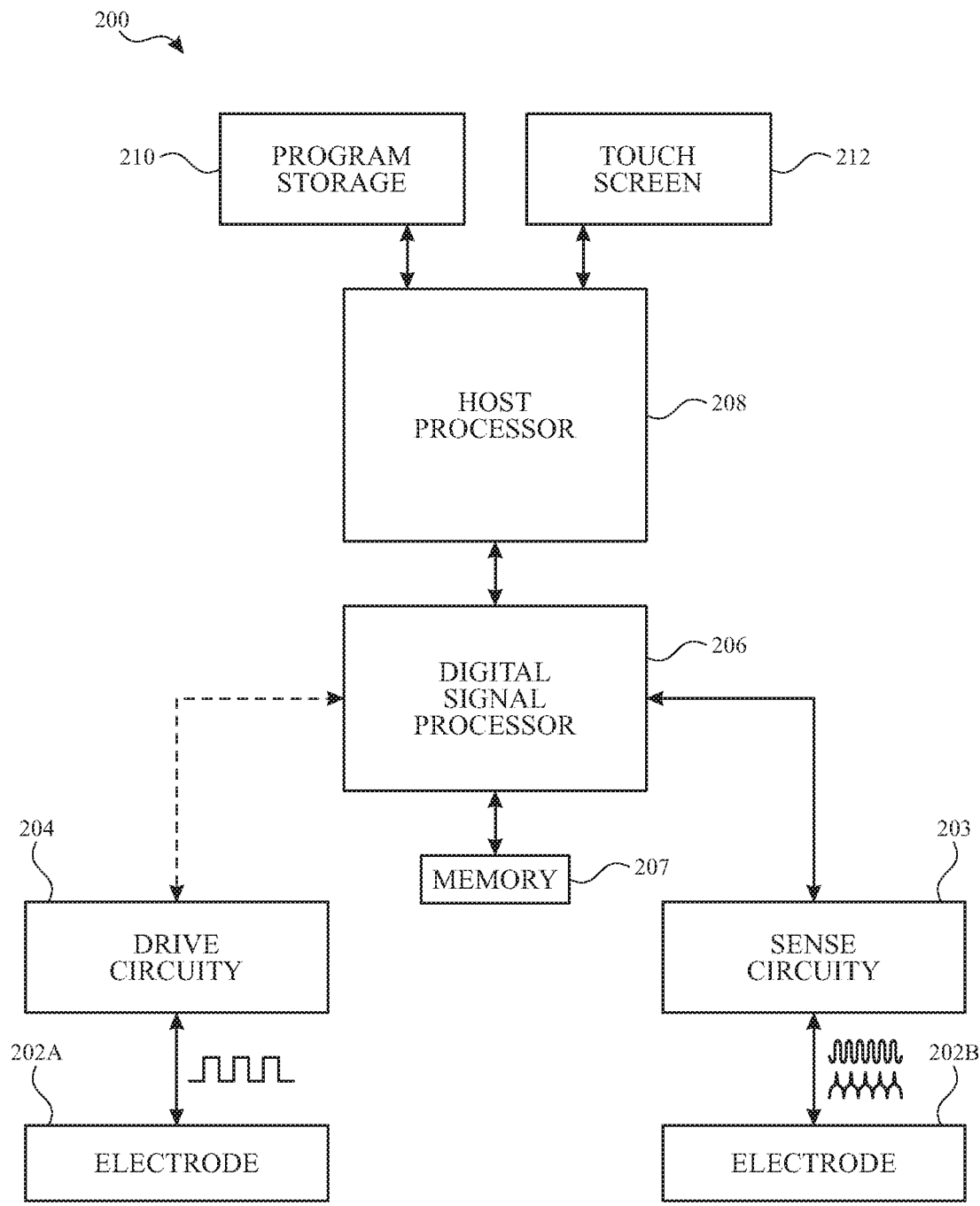
FIG. 2 illustrates a block diagram of an example computing system 200 for skin-to-skin contact detection according to examples of the disclosure.

FIG. 2 illustrates a block diagram of an example computing system 200 for skin-to-skin contact detection according to examples of the disclosure. Computing system 200 can include electrodes 202A-202B, sense circuitry 203, drive circuitry 204 to stimulate first body part with drive signals and measure sensed signals from a second body part. In some examples, the drive circuitry can include a voltage source or (constant) current source to generate the stimulation signal. In some examples, the stimulation signal can have a square waveform. In some examples, the stimulation signal can have a frequency greater than 500 kHz. In some examples, the stimulation signal can be between 1 MHz and 10 Mhz. The drive signal can be applied as a single-ended stimulus via one drive electrode or as a differential signal referenced to a second drive electrode (a floating or ground reference). In some examples, the sense circuitry can include an amplifier (with a feedback network between the input(s) and output(s)). In some examples, the amplifier can be single-ended with the inverting input coupled to the sense electrode and the non-inverting input coupled to a reference electrode (e.g., a ground electrode or a floating electrode). In some examples, the amplifier can be differential with the inverting input coupled to a first sense electrode and the non-inverting input coupled to a second sense electrode. A ground electrode can be coupled between the two sense electrodes. In some examples, the sense circuitry can include multiple amplifiers to sense signals received a multiple sense electrodes (in a single-ended or differential manner). Additionally, computing system 200 can include a digital signal processor (DSP) 206 to analyze and process the sensed signals for skin-to-skin contact detection (and/or gesture detection), and optionally memory 207 to store the data from sense circuitry 203 and/or store configuration data or instructions for DSP 206. In some examples, computing system 200 can also include host processor 208, program storage 210 and touch screen 212 (or other display) to perform display or other operations (e.g., in response to skin-to-skin contact). The components of computing system 200 are described in more detail below.

Host processor 208 can be connected to program storage 210 to execute instructions stored in program storage 210 (e.g., a non-transitory computer-readable storage medium). Host processor 208 can, for example, provide control and data signals to generate a display image on touch screen 212 (or other display devices), such as a display image of a user interface (UI). Host processor 208 can also receive outputs from DSP 206 (e.g., detection of skin-to-skin contact and/or gestures as touch input) and perform actions based on the outputs (e.g., selection of content or scroll content in a real-world, virtual reality or mixed reality environment, etc.). Host processor 208 can also receive outputs (touch input) from touch screen 212 (or a touch controller, not shown). The input (e.g., touch input from touch screen 212 or skin-to-skin contact/gesture input from DSP 206) can be used by computer programs stored in program storage 210 to perform actions. The actions can include, but are not limited to, moving an object such as a cursor or pointer, scrolling or panning, adjusting control settings, opening a file or document, viewing a menu, making a selection, executing instructions, operating a peripheral device connected to the host device, answering a telephone call, placing a telephone call, terminating a telephone call, changing the volume or audio settings, storing information related to telephone communications such as addresses, frequently dialed numbers, received calls, missed calls, logging onto a computer or a computer network, permitting authorized individuals access to restricted areas of the computer or computer network, loading a user profile associated with a user's preferred arrangement of the computer desktop, permitting access to web content, launching a particular program, encrypting or decoding a message, and/or the like. Host processor 208 can also perform additional functions that may not be related to touch processing and display.

Note that one or more of the functions described herein, including the analysis and processing of sensed signals for skin-to-skin contact detection, can be performed by firmware stored in memory 207 and executed by one or more processors (e.g., in DSP 206), or stored in program storage 210 and executed by host processor 208. The firmware can also be stored and/or transported within any non-transitory computer-readable storage medium for use by or in connection with an instruction execution system, apparatus, or device, such as a computer-based system, processor-containing system, or other system that can fetch the instructions from the instruction execution system, apparatus, or device and execute the instructions. In the context of this document, a "non-transitory computer-readable storage medium" can be any medium (excluding signals) that can contain or store the program for use by or in connection with the instruction execution system, apparatus, or device. The computer-readable storage medium can include, but is not limited to, an electronic, magnetic, optical, electromagnetic, infrared, or semiconductor system, apparatus or device, a portable computer diskette (magnetic), a random access memory (RAM) (magnetic), a read-only memory (ROM) (magnetic), an erasable programmable read-only memory (EPROM) (magnetic), a portable optical disc such a CD, CD-R, CD-RW, DVD, DVD-R, or DVD-RW, or flash memory such as compact flash cards, secured digital cards, USB memory devices, memory sticks, and the like.

The firmware can also be propagated within any transport medium for use by or in connection with an instruction execution system, apparatus, or device, such as a computer-based system, processor-containing system, or other system that can fetch the instructions from the instruction execution system, apparatus, or device and execute the instructions. In the context of this document, a "transport medium" can be any medium that can communicate, propagate or transport the program for use by or in connection with the instruction execution system, apparatus, or device. The transport medium can include, but is not limited to, an electronic, magnetic, optical, electromagnetic or infrared wired or wireless propagation medium.

It is to be understood that the computing system 200 is not limited to the components and configuration of FIG. 2, but can include other or additional components (or omit components) in multiple configurations according to various examples. For example, an analog-to-digital converter (ADC) may be included as part of the sense circuitry 203 or between sense circuitry 203 and DSP 206 to convert the signals to the digital domain from the analog domain. As another example, touchscreen 212 can be omitted and the input information from the analysis and processing by DSP 206 can be relayed to another device (e.g., a tablet, laptop, smartphone, computer, server, etc.) via wired or wireless connection that can include a display (e.g., a real-world or virtual or mixed reality display). Additionally, the components of computing system 200 can be included within a single device, or duplicated in part or in whole in multiple devices in a system (e.g., as illustrated in and described with reference to FIG. 1A), or can be distributed between multiple devices. In some examples, the drive circuitry 204 and/or sense circuitry 203 can be in separated from the electrodes such that the drive/sense circuitry can be implemented in a device worn on the wrist (or a first part of the body, generally) and the electrodes can be worn on or near the fingers (e.g., as part of devices 708A-708B) or palms (or a second different part of the body, generally).

Referring back to sense circuitry 203, sense circuitry 203 can measure sensed signals and can be in communication with DSP 206 to provide the sensed signals to DSP 206. In some examples, the sensed signals can be stored in memory 207 (e.g., acting as a data buffer) and the DSP 206 can acquire a buffered sample of the sensed signal waveform for analysis as described herein. In some examples, memory 207 can be implemented as part of DSP 206. It should be understood that although a DSP is described, other processing circuits could be used to implement the analysis and processing described herein including a microprocessor, central processing unit (CPU), programmable logic device (PLD), and/or the like.

Figure 3B:
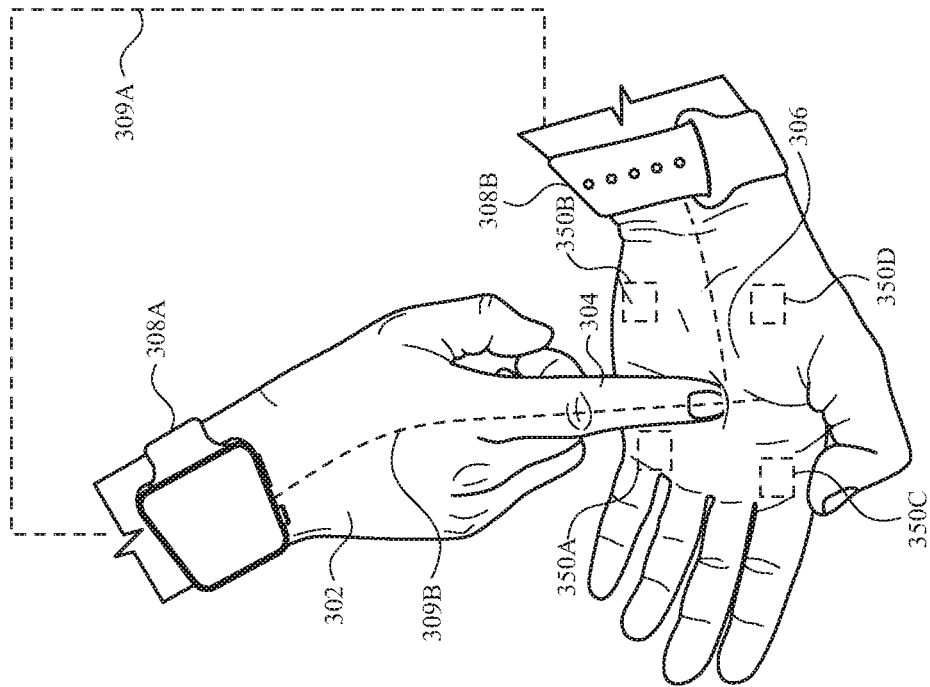
FIGS. 3A-3B illustrate a proximity and a contact, respectively, between a first body part and a second body part according to examples of the disclosure.
Figure 3A:
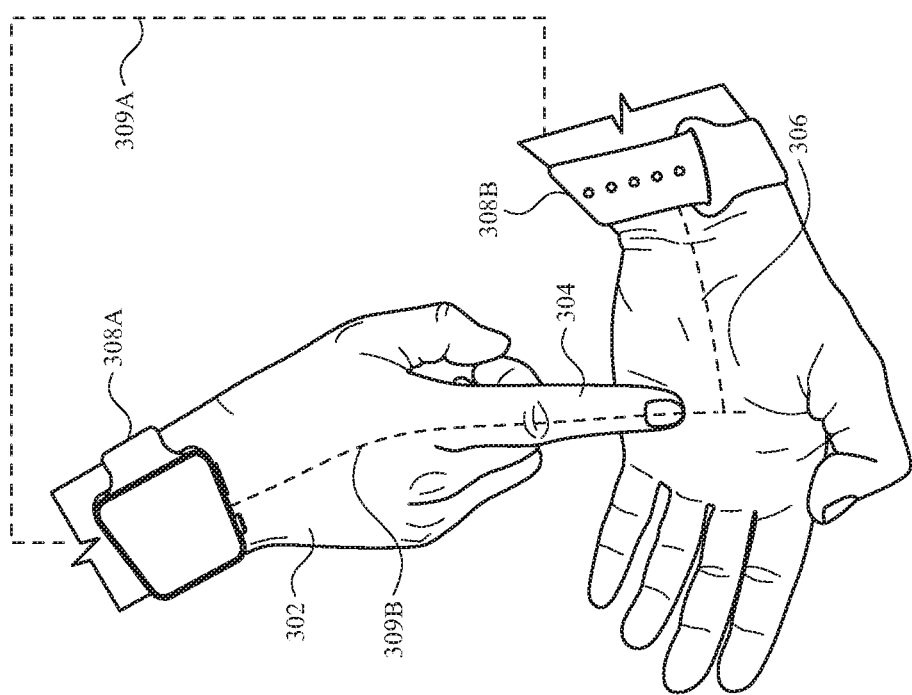
Figure 4A:
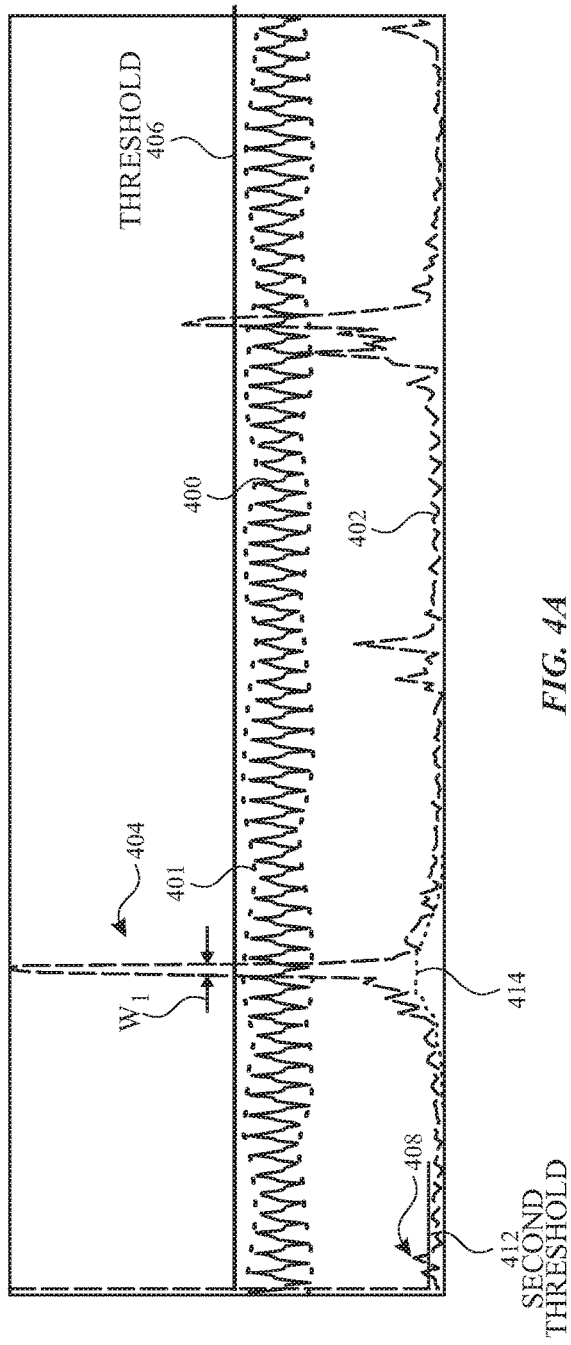
FIGS. 4A-4B illustrate time-domain and frequency domain representations of the sensed signal corresponding to the proximity or the contact according to examples of the disclosure.
Figure 4B:
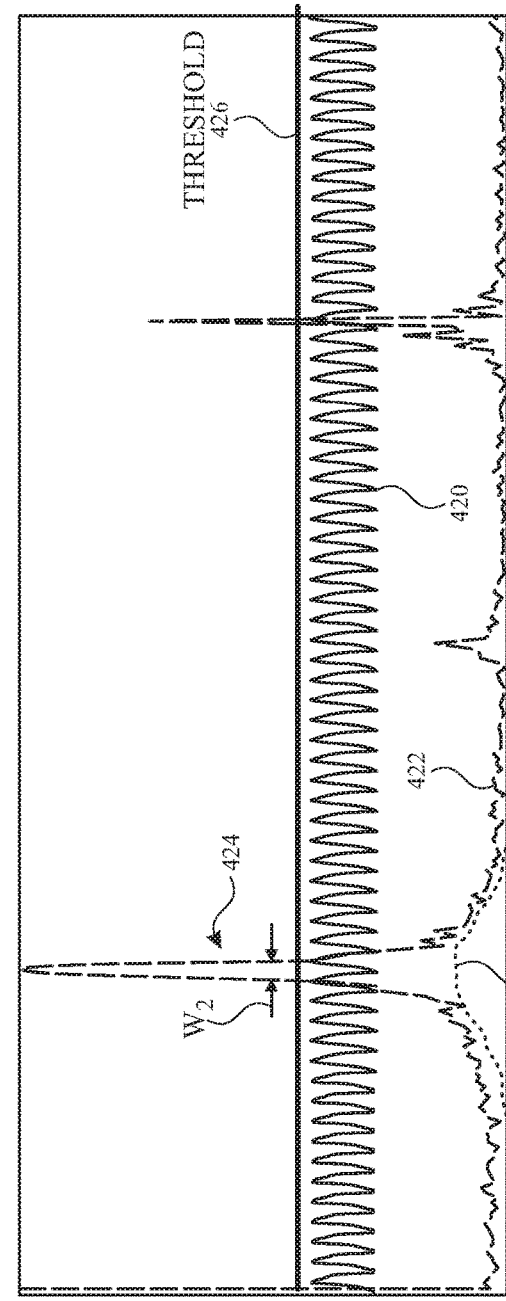

FIGS. 3A-3B illustrate a proximity and a contact, respectively, between a first body part and a second body part according to examples of the disclosure. FIGS. 4A-4B illustrate time-domain representations 400, 420 and frequency domain representations 402, 422 of the sensed signal corresponding to the proximity or the contact according to examples of the disclosure. With or without contact or proximity, the stimulation generated by wearable device 308A (e.g., corresponding to wearable device 150, drive circuitry 204 and electrode 202A) can propagate through the body via a first path 309A, and can be received by wearable device 308B (e.g., corresponding to wearable device 150, sense circuitry 203 and electrode 202B). A second path 309B can be formed between wearable devices 308A-308B due to contact or proximity between index finger 304 and/or right hand 302 and left hand 306. The second path 309B can cause changes to the sensed signal when contact or proximity between index finger 304 and hand 306 occurs compared with the expected sensed signal from first path 309A. FIG. 3A illustrates that a second path 309B can be formed between index finger 304 of right hand 302 in proximity to the palm of left hand 306 (e.g., a capacitive path). FIG. 3B illustrates that a second path 309B can be formed between index finger 304 of right hand 302 in contact with the palm of left hand 306. The differences in the sensed waveform can be used to distinguish between skin-to-skin touch and skin-to-skin proximity.

In particular, as shown in FIGS. 4A-4B, the amplitude of a frequency domain peak (e.g., peak 404 in FIG. 4A and peak 424 in FIG. 4B) can increase relative to reference peak 414 due to proximity or contact. Thus, an amplitude criterion can be used to detect skin-to-skin contact or proximity. For example, when the peak 404, 424 exceeds a threshold 406, 426, the processing circuitry (e.g., DSP 205) can detect contact or proximity. When peak 404, 424 is below the threshold 406, 426, the processing circuitry (e.g., DSP 205) can detect an absence of contact or proximity. In some examples, threshold 406 and threshold 426 illustrated in FIGS. 4A-4B can be the same threshold, and one or more additional criteria can be used to differentiate between a touch event and a proximity event, as described in more detail below. Although shown as frequency domain thresholds, it should be understood that time domain thresholds can be used instead for time domain representations 400, 420, in some examples. In some examples, thresholds 406 and 426 can be different thresholds, and can be used to differentiate between a touch event and a proximity event. For example, the relative amplitude increase of peak 404 corresponding to a proximity event can be less than the amplitude increase of peak 424 corresponding to a touch event. A first, higher threshold can be set to detect a touch event, and a second, lower threshold can be set to detect a proximity event (e.g., when the amplitude is less than the first threshold but above the second threshold).

Relying on an amplitude criterion alone for differentiation between a touch and hover, however, may be inaccurate (false detection of touch and/or proximity events) because the amplitude may be a function of more than the distance between the two body parts (the difference between touch versus proximity). For example, the capacitive nature of the second path 309B for a proximity event (without contact) can result in amplitude changes in the sensed signal that can be a function of the distance between two body parts (e.g., a distance between left hand 306 and index finger 304/right hand 302) and also the size of the body parts (e.g., the size of finger 304 as compared with the hand 302). Likewise, the second path 309B for a contact event can see amplitude changes based on the size contact, which can change based on the amount of force applied or the number of fingers making contact, for example. As a result, the approach of index finger 304 of right hand 302 and the proximity of right hand 302 and left hand 306 can result in an amplitude spike indicative of contact based on the amplitude threshold before index finger 304 makes contact with left hand 306. This can cause a false detection of contact (e.g., detecting contact while the finger hovers), and even if contact occurs subsequently, the amplitude spike can mask the contact of index finger 304 (because the subsequent amplitude change may be a relatively small change compared with the proximity of the larger hands). Additionally, the timing of the moment of contact (even if it can be differentiated from proximity) may be imprecise.

As described herein, one or more additional criteria can be used to improve skin-to-skin contact or proximity detection. The one or more additional criteria can be related to other characteristics of the sensed signal. In some examples, the one or more additional criteria can correspond to whether the sensed signal has a distorted waveform or not. For example, time domain representation 400 corresponding to a proximity event can include distortion compared with the time domain representation corresponding to a touch event. The waveform can appear more similar to a saw-tooth waveform (distorted in FIG. 4A) than a sine waveform (non-distorted in FIG. 4B).

Figure 5:
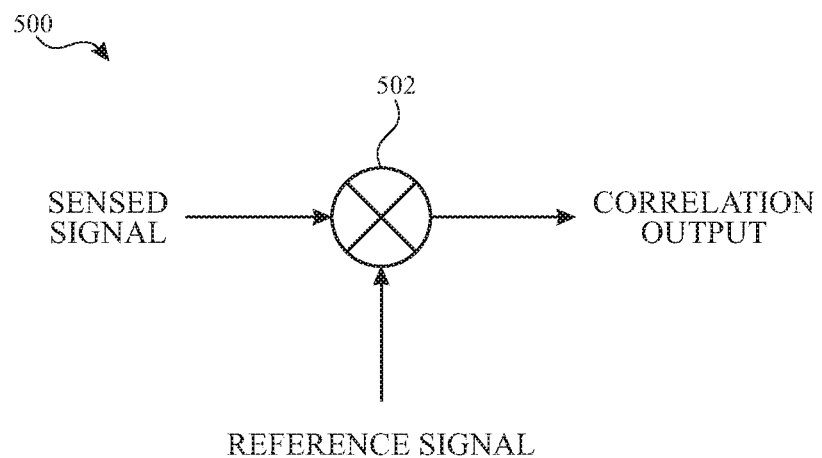
FIG. 5 illustrates a block diagram of a correlation circuit 500 according to examples of the disclosure.

In some examples, the sensed signal can be correlated with a reference waveform. For example, a reference waveform can be a sine waveform corresponding to the sensed signal without contact or proximity events. For example, FIG. 5 illustrates a block diagram of a correlation circuit 500 according to examples of the disclosure. Correlator 502 of correlation circuit 500 can receive the sensed signal as a first input and a reference signal as a second signal, and can output a correlation of the input signals. The sensed signal can be provided by sense circuitry 203 directly or from storage in memory 207, for example. The reference signal can be stored in memory 207. Correlator 502 can be implemented, in some examples, in DSP 206. When the correlation is high (above a threshold) between the sensed signal and the reference waveform, the processing circuitry (e.g., DSP 206) can determine that the signal has a non-distorted waveform and/or detect a skin-to-skin contact event. When the correlation is low (below the threshold) between the sensed signal and the reference waveform, the processing circuitry (e.g., DSP 206) can determine that the signal has a distorted waveform and/or detect a proximity event (without contact). In some examples, the reference waveform can be a saw-tooth waveform, and the conventions can be reversed with respect to the threshold (e.g., high correlation corresponds to distortion/proximity and low correlation corresponds to contact). It should be understood that the sensed signal and reference signal waveforms illustrated correspond to a square wave stimulation applied to the body. However, a different stimulation signal, sensed signal, and reference signal can be used in other examples. Although described as a correlation of the time domain representations, correlation can also be performed on frequency domain representations.

In some examples, a second criterion can be based on the width of a frequency domain peak. The width of the peak 404, 424 ($W_1$, $W_2$ respectively) in the frequency domain can provide an indication of distortion. For example, a frequency domain representation of a pure sine wave at one frequency can be spike at that frequency. The narrower the width of the peak, the closer the sensed signal is to a sine wave. Thus, a width threshold can be used to determine whether the sensed signal is distorted or non-distorted based on how the width of the peak compares with the width threshold. When the width of peak 404, 424 is below the threshold, the processing circuitry (e.g., DSP 206) can determine that the signal has a non-distorted waveform and/or detect a skin-to-skin contact event. When the width of peak 404, 424 is above the threshold, the processing circuitry (e.g., DSP 206) can determine that the signal has a distorted waveform and/or detect a proximity event (without contact).

In some examples, the width of the peak can be measured at a fixed point (e.g., at a fixed amplitude point). For example, the width can be measured at the amplitude threshold 406, 426, or at another fixed point. In some examples, the width measurement can be normalized according to the amplitude of the peak (because peaks may widen as the amplitude increases). The amplitude-normalized width of the peak can be used with the amplitude-normalized width threshold in a similar manner as described above. In some examples, the width can be measured at a midpoint of the amplitude of the peak. In some examples, the amplitude-normalized width can be a ratio of the width at a fixed amplitude point to the maximum amplitude at the peak (e.g., scaled according to maximum amplitude) that can be compared to an amplitude-normalized width threshold.

In some examples, a second criterion can be based on an envelope of the sensed signal. As illustrated in FIG. 4A, time domain representation 400 of the sensed signal includes an envelope 401 when a proximity event occurs, whereas as illustrated in FIG. 4B the envelope can be essentially flattened when a contact event occurs. In some examples, the envelope can appear as a second, low-frequency peak 408 (relative to peak 404) in the frequency domain representation 402. When the amplitude of the second peak 408 is above a second amplitude threshold 412 (different and lower than amplitude threshold 406), the processing circuitry (e.g., DSP 206) can determine that the signal has a distorted waveform and/or detect a proximity event (without contact). When the second peak 408 is below threshold 412 (or non-existent), the processing circuitry (e.g., DSP 206) can determine that the signal has a non-distorted waveform and/or detect a skin-to-skin contact event. Although described as frequency domain processing to identify the existence of the envelope in a beat frequency, alternatively processing can be performed in the time domain using the time domain representation of the envelope with a threshold based on the flatness of the envelope function.

In some examples, the second criterion can be based on a phase shift between the stimulation signal and the sensed signal. For example, in addition to receiving the sensed signal, the processing circuitry (e.g., DSP 206) can also receive the drive signal. The processing circuitry can calculate the phase shift. Thus, a phase shift threshold can be used to determine whether the sensed signal is distorted or non-distorted based on how the calculated phase shift compares with the phase shift threshold. In some examples, when the phase shift is below the threshold, the processing circuitry (e.g., DSP 206) can determine that the signal has a non-distorted waveform and/or detect a skin-to-skin contact event. When the phase shift is above the threshold, the processing circuitry (e.g., DSP 206) can determine that the signal has a distorted waveform and/or detect a proximity event (without contact).

In some examples, the one or more criteria can include a third criterion. For example, when hands are within the field of view of a camera or cameras (not shown in FIG. 2), processing circuitry can receive an input stream from the camera(s) and can estimate whether a contact or proximity event occurs using the camera input. In some examples, the camera may provide useful information about the size, position and orientation of the body parts, which may used to differentiate between an amplitude spike caused by large objects in proximity (e.g., two parallel palms) versus contact between two smaller objects (e.g., two finger tips). However, it is understood that the detection of and differentiation between skin-to-skin contact events and proximity events can be performed even without the use of a camera. Detection without the camera(s) may be particularly advantageous when one or both hands are out of the field of view of the camera(s) or one of the hands occludes the other of the hands (making optical detection of whether objects are touching or in proximity difficult).

Figure 6:
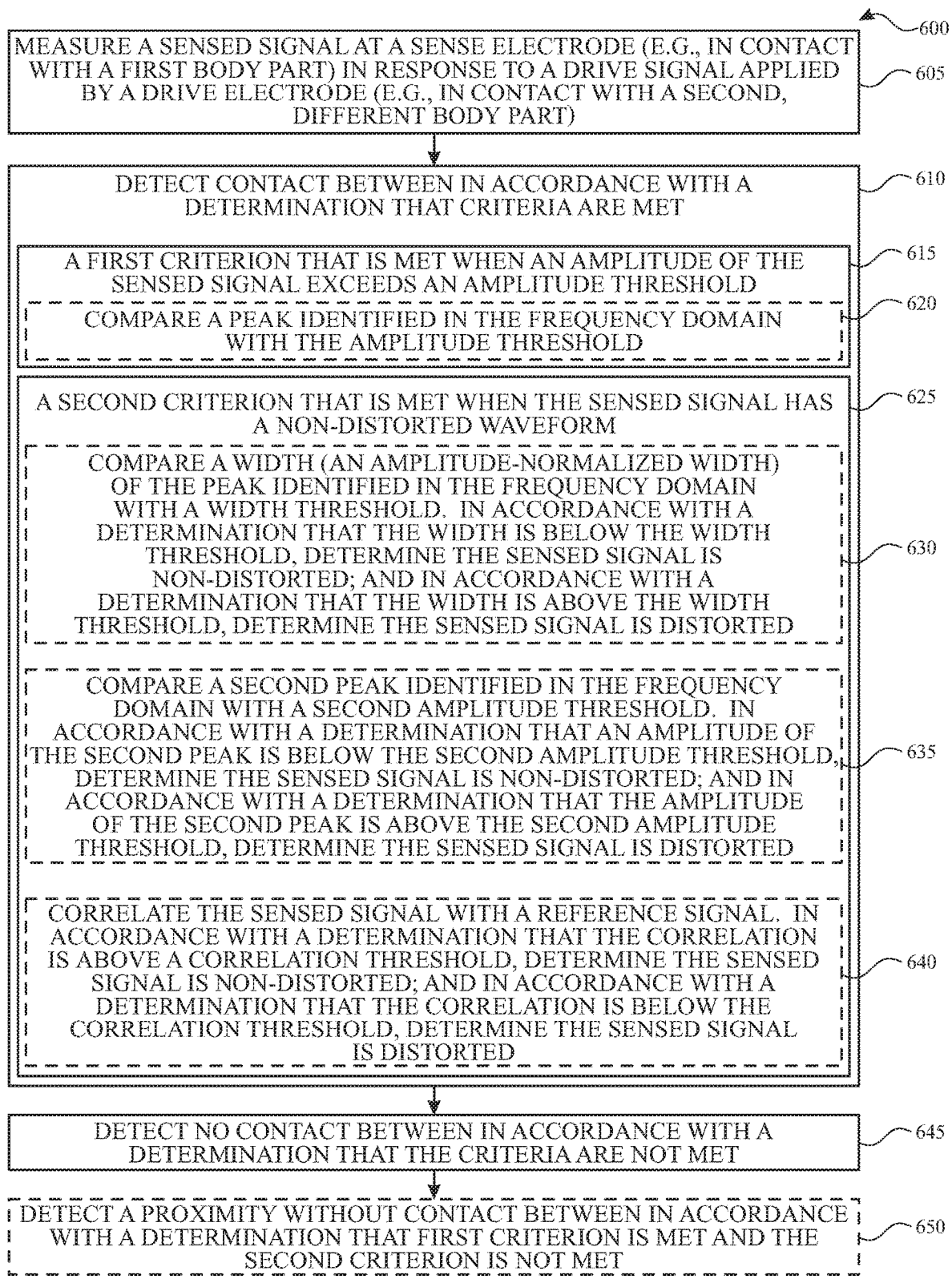
FIG. 6 illustrates an example process of skin-to-skin contact detection according to examples of the disclosure.

FIG. 6 illustrates an example process 600 of skin-to-skin contact detection according to examples of the disclosure. At 605, a sensed signal can be measured at a sense electrode (e.g., in contact with a first body part) in response to a drive signal applied by a drive electrode (e.g., in contact with a second body part, different from the first body part). In some examples, the drive signal can be a square wave with a frequency greater than 500 kHz. In some examples, the drive signal can be a square wave with a frequency between 1 MHz and 10 MHz. The sensed signal can be processed to detect skin-to-skin contact between two body parts. In some examples, the processing can include transforming the sensed signal from a time domain to a frequency domain (e.g., using a fast Fourier transform (FFT) or other suitable technique). In some examples, the processing can be performed entirely in the time domain without transforming the sensed signal to the frequency domain. The processing can include, at 610, detecting contact between the first body part and the second body part in accordance with a determination that one or more criteria are met. The one or more criteria can include a first criterion that is met when an amplitude of the sensed signal exceeds an amplitude threshold (615). For example, determining whether the amplitude of the sensed signal exceeds the amplitude threshold for evaluating the first criterion can include comparing a peak identified in the frequency domain with the amplitude threshold (620). The one or more criteria can include a second criterion that is met when the sensed signal has a non-distorted waveform (625). Evaluating the second criterion can include, in some examples, comparing a width (in some examples an amplitude-normalized width) of the peak identified in the frequency domain with a width threshold (630). In accordance with a determination that the width is below the width threshold, determining that the sensed signal has the non-distorted waveform (the second criterion is met); and in accordance with a determination that the width is above the width threshold, determining that the sensed signal has a distorted waveform (the second criterion is not met). Evaluating the second criterion can include, in some examples, comparing a second, low-frequency peak identified in the frequency domain with a second amplitude threshold (635). In accordance with a determination that an amplitude of the second peak is below the second amplitude threshold (or in the absence of a second peak at the lower frequency), the processing circuitry can determine that the sensed signal has the non-distorted waveform (the second criterion is met). In accordance with a determination that the amplitude of the second peak is above the second amplitude threshold, the processing circuitry can determine that the sensed signal has a distorted waveform (the second criterion is not met). Evaluating the second criterion can include, in some examples, correlating the sensed signal with a reference signal (640). In accordance with a determination that the correlation is above a correlation threshold, determining that the sensed signal has the non-distorted waveform (the second criterion is met); and in accordance with a determination that the correlation is below the correlation threshold, determining that the sensed signal has a distorted waveform (the second criterion is not met). Process 600 can include, at 645, detecting no contact between the first body part and the second body part in accordance with a determination that the one or more criteria are not met. Process 600 can include, at 650, detecting a proximity without contact between the first body part and the second body part in accordance with a determination that first criterion is met and that the second criterion is not met.

It is understood that process 600 is an example process and that some of the processing mentioned above can be omitted or different processing may be performed. For example, the second criterion can be evaluated using processing of 630, 635 or 640. In some examples, the second criterion can met when multiple characteristics indicate non-distortion of the waveform (e.g., using processing of 630, 635 and/or 640).

In some examples, in addition to detecting skin-to-skin contact, skin-to-skin gestures can be detected as well. For example, the gestures enabled by skin-to-skin contact can include a tap, double tap, tap-and-hold (long press) and the like. In additional, other skin-to-skin contact gestures can be enabled based on movement subsequent to contact. For example, a sliding gesture can be detected based on skin-to-skin contact followed on-skin movement (e.g., prior to breaking skin-to-skin contact). In some examples, the skin-to-skin contact can be between two fingers on the same hand and the sliding gesture can be one finger sliding along a second finger on the same hand.

Figure 8A:
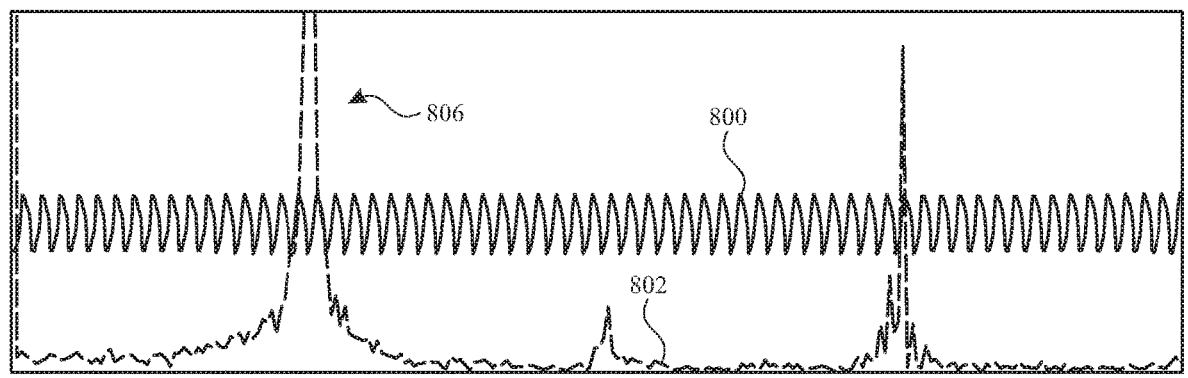
FIGS. 8A-8C illustrate time-domain representations and frequency domain representations of the sensed signal corresponding to a finger-to-finger slide gesture according to examples of the disclosure.
Figure 8B:
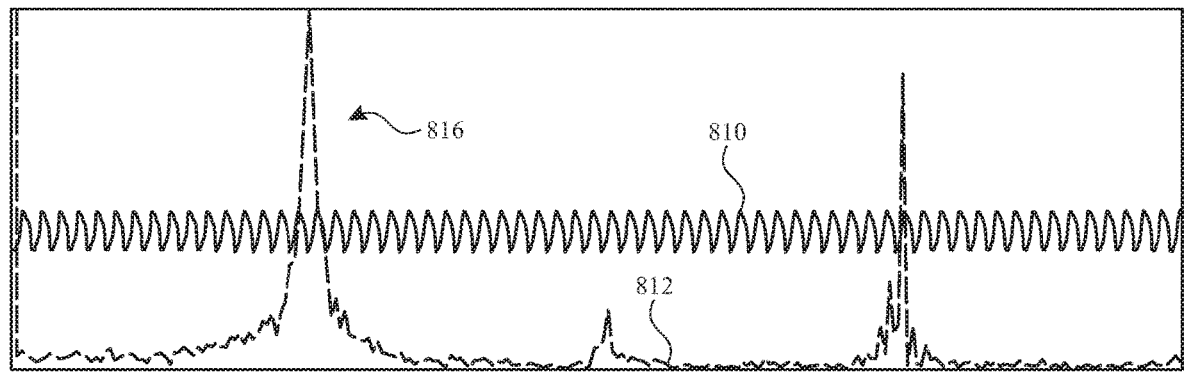
Figure 8C:
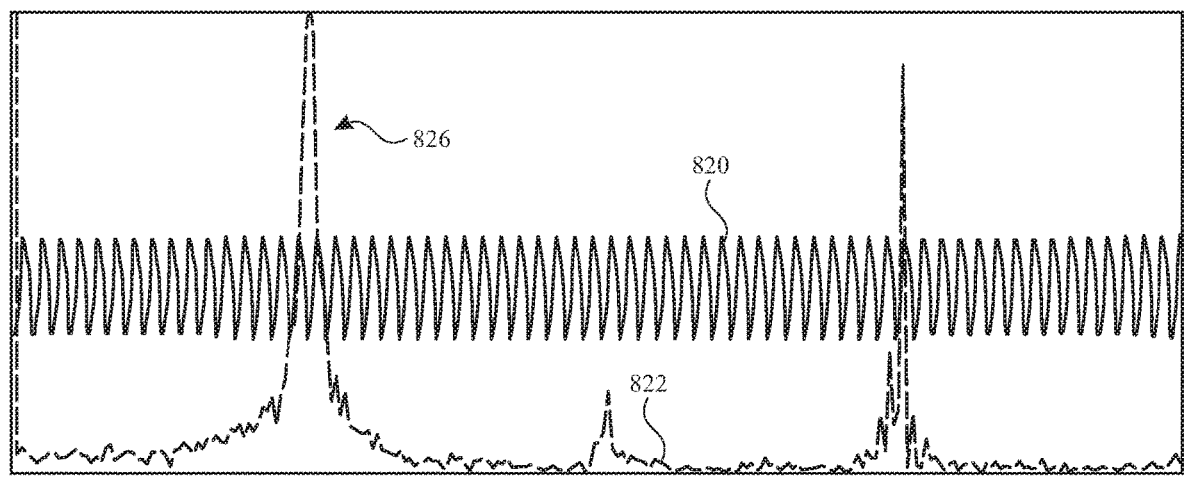

FIGS. 7A-7B illustrate an example system for detection of a skin-to-skin gesture according to examples of the disclosure. In particular, FIGS. 7A-7B illustrate a slide gesture between a first finger and a second finger of the same hand according to examples of the disclosure. The system can use a computing system including the same or similar components as described with reference to computing system 200. FIGS. 8A-8C illustrate time-domain representations 800, 810 and 820 and frequency domain representations 802, 812, 822 of the sensed signal corresponding to a finger-to-finger slide gesture according to examples of the disclosure. As illustrated in FIGS. 7A-7B, a first wearable device 708A (e.g., corresponding to wearable device 150, drive circuitry 204 and electrode 202A) can be coupled on a first finger, thumb 702, and a second wearable device 708B (e.g., corresponding to wearable device 150, sense circuitry 203 and electrode 202B) can be coupled on a second finger, index finger 704. In some examples, the first wearable device 708A can be disposed at or near (within a threshold distance of) the midpoint of thumb 702 (e.g., at or near the boundary between the distal bone and the proximal bone). In some examples, the first wearable device 708A can be disposed at or near (within a threshold distance of) the base of thumb 702 (e.g., at or near the base of the metacarpal bone). In some examples, the second wearable device 708B can be disposed at or near (within a threshold distance of) the base of index finger 704 (e.g., at or near the base of the metacarpal bone). In some examples, the first wearable device 708A can be finger cuff and the second wearable device 708B can be a ring. In some examples, the first and second wearable devices can be implemented as part of a glove.

With or without the contact between thumb 702 and index finger 704 shown in FIGS. 7A-7B, the stimulation generated by wearable device 708A can propagate through the body via a first path 709A, and can be received by wearable device 708B. A second path 709B can be formed between wearable devices 708A-708B due to contact between thumb 702 and index finger 704. The second path 709B can cause changes to the sensed signal compared with the expected sensed signal from first path 709A when contact between thumb 702 and index finger 704 occurs. The changes to the sensed signal can be different depending upon the location of thumb 702 on index finger 704. In particular, the closer the tip of thumb 702 is to the tip of index finger 704, the higher the resistance of the second path and the lower the resulting amplitude spike due to contact. In a similar manner, the closer the tip of thumb 702 is to the base of index finger 704 (and wearable device 708B), the lower the resistance of the second path and the larger the resulting amplitude spike due to contact. The changes in the sensed waveform (e.g., the difference in amplitude spike) can be used to identify movement of the contact location between the two fingers to identify a gesture (e.g., a slide gesture).

The detection of a movement gesture can include the detection of contact between the first finger and the second finger (e.g., thumb 702 and index finger 704) and the detection of movement of the first finger along the second finger. The skin-to-skin contact of thumb 702 and index finger 704 can be detected via the one or more criteria (e.g., including an amplitude criterion and a non-distortion criterion) as discussed above and not repeated here for brevity. The movement of the contact can be detected by an increase or decrease in amplitude of the sensed signal (relative to the initial amplitude at contact) while skin-to-skin contact is maintained.

FIG. 8A, for example, shows a frequency domain peak 806 corresponding to an initial contact (e.g., corresponding to the position of the fingers shown in FIG. 7A). FIGS. 8B and 8C show the corresponding frequency domain peaks corresponding to a subsequent contact. FIG. 8B, for example, shows a frequency domain peak 816 corresponding to a subsequent contact with a decreased amplitude peak indicative of movement away from the base of the finger (e.g., away from wearable device 708B). FIG. 8C, for example, shows a frequency domain peak 826 corresponding to a subsequent contact with an increased amplitude peak, indicative of movement toward the base of the finger (e.g., toward from wearable device 708B, corresponding to the position of the fingers shown in FIG. 7B). Detection of movement away from the base of the finger can correspond to a slide-away gesture, and detection of movement toward the base of the finger can correspond to a slide-toward gesture. The slide-away and slide-toward gestures can provide different inputs to a system. In some examples, the opposite directions of the slide inputs can correspond to opposite functionality (e.g., raising vs. lowering volume, moving a slider control in opposite directions, etc.). Although shown as frequency domain peaks, it should be understood that changes of amplitude in the time domain can be used instead for detection of movement and determining a direction of sliding.

In some examples, in order to detect a slide gesture, the amount of movement must be a threshold amount of movement in order to avoid false positives when a change in amplitude detected may due to other reasons other than a change in position (e.g., movement). For example, the other reasons may include a change in the size of the contact (e.g., by adding/removing fingers, pressing with more/less force with the finger, or changing the orientation of the finger) or adding moisture. Additionally or alternatively to requiring a threshold amount of movement to identify a movement gesture, in some examples, information from another sensor can be used to exclude these external causes. For example, camera(s) or other optical sensor(s), a force sensor or moisture sensor can be used to exclude other causes of the change in the amplitude of the finger. For example, camera(s)/optical sensor(s) can be used to exclude the change in number of fingers or the orientation or force of the finger. A force sensor can be used to exclude the change in applied force. A moisture sensor can be used to exclude a change in moisture.

Additionally or alternatively, in some examples, one or more additional sense electrodes and corresponding sense circuitry can be used to record multiple measurements along a finger (e.g., along index finger 704). For example, an additional sense electrode and/or sense circuitry can be located at or near the distal bone of index finger 704 in addition to the electrode and/or sense circuitry at or near the base of the metacarpal bone of index finger 704. In some examples, the slide of thumb 702 can be detected based on both the increase in the sensed signal at one sense electrode and the decrease in the sensed signal at the other sense electrode (or visa versa). In some examples, a differential measurement of the signal sensed from the two sense electrodes can be taken and the increase or decrease in the differential sensed signal can be used to detect a slide gesture. Such a differential measurement can improve rejection of alternative sources of signal amplitude change that may be common mode. For example, the change in amplitude due to applied force can appear as common mode at both sense electrodes and thus may be removed by a differential measurement (thereby reducing false positive detection of force as a gesture). It is understood that the differential measurement can provide a similar benefit to reducing false positives in skin-to-skin contact detection as described herein (e.g., not limited to reducing false positives for gesture detection).

Although movement gestures are described herein primarily with respect to finger-to-finger gestures, it should be understood that gestures may be detected using other body parts. For example, using the wearable devices of FIGS.

3A-3B, a sliding gesture may be detected of one finger on one hand sliding along a second finger of the other hand. Additionally or alternatively, a sliding gesture may be detected of one finger along a palm of the other hand. In some examples, multiple sense electrodes (and corresponding sensing circuitry) can be located at different parts of the palm. For example, as shown in FIG. 3B, four sensing electrodes 350A-350D can be disposed at approximately four corners of the palm (e.g., in a glove for example) and can be sensed with corresponding sensing circuitry (e.g., co-located or located elsewhere, such as on the backside of the palm or in wearable device 308B). Based on the relative changes in amplitude at the multiple sense electrodes, the processing circuitry can determine relative movement of the index finger 304. As a result, multiple directional slide gestures can be enabled (e.g., slide up, slide down, slide left, slide right, diagonal slides, etc.). The sensed signals may be differential between sense electrodes to reduce common mode changes to signal amplitude due to applied force as described above.

Figure 9:
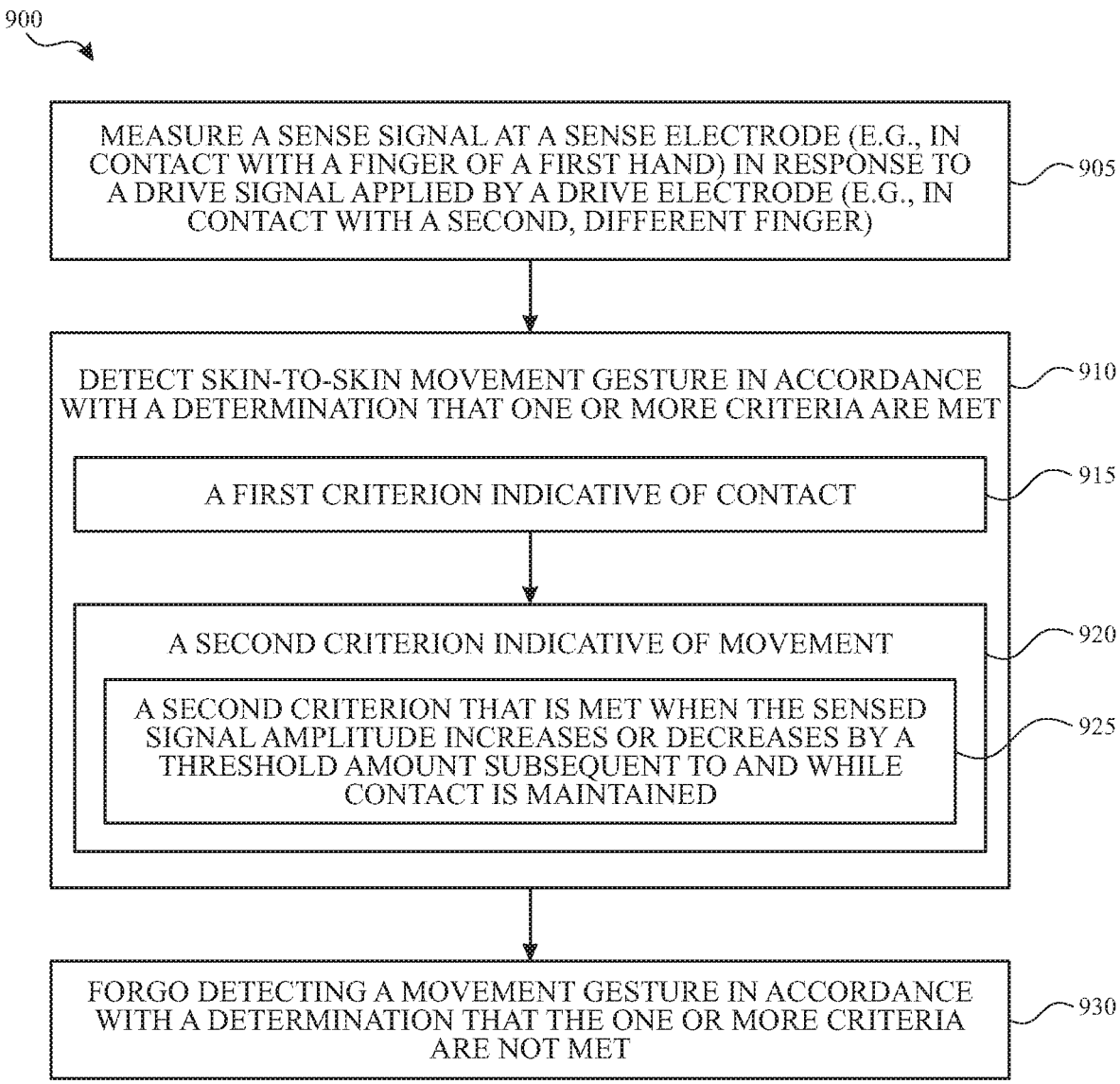
FIG. 9 illustrates an example process of skin-to-skin gesture detection according to examples of the disclosure.

FIG. 9 illustrates an example process 900 of skin-to-skin gesture detection according to examples of the disclosure. At 905, a sensed signal can be measured at a sense electrode (e.g., in contact with a finger of a hand) in response to a drive signal applied by a drive electrode (e.g., in contact with a different finger of the same hand). In some examples, the drive signal can be a square wave with a frequency greater than 500 kHz. In some examples, the drive signal can be a square wave with a frequency between 1 MHz and 10 MHz. At 910, the sensed signal can be processed to detect a skin-to-skin contact gesture in accordance with a determination that one or more criteria are met. In some examples, the processing can include, at 915, detecting skin-to-skin contact between the two fingers in accordance with a determination that one or more contact criteria are met (e.g., as described above with respect to process 900, and not repeated here for brevity). The processing can include, at 920, detecting movement of a first finger along a second finger. Detecting movement of the first finger along the second finger can be based on an increase or decrease in amplitude of the sensed signal subsequent to and while contact is made between the first and second fingers (925). In some examples, the increase or decrease in amplitude (relative to the initial amplitude upon contact) can be based on the time domain sensed signal. In some examples, the increase or decrease in amplitude can be based on the frequency domain sensed signal (e.g., such that the processing may include a frequency domain transformation). An increase in amplitude from an initial amplitude upon contact can be indicative of a slide-toward gesture. A decrease in amplitude from the initial amplitude upon contact can be indicative of a slide-away gesture. In some examples, to reduce false positive detection of a gesture, that a threshold amount of increase or decrease in amplitude may be required (corresponding to a threshold amount of movement) to detect a gesture. In some examples, to reduce false positive detection of a gesture, an additional sensor may be used to exclude another source of the increase or decrease (e.g., a camera, force sensor, etc.). At 930, in accordance with a determination that the one or more criteria are not met, the processing circuitry (e.g., DSP 206) can forgo detecting the movement gesture. It is understood that process 900 is an example and that some of the processing mentioned above can be omitted or different processing may be performed.

Therefore, according to the above, some examples of the disclosure are directed to a system. The system can comprise sense circuitry and processing circuitry. The sense circuitry can be coupled to a sense electrode, the sense circuitry configured to sense a signal at the sense electrode in response to a drive signal applied to a first body part. The sense electrode can be configured to contact a second body part, different from the first body part. The processing circuitry can be configured to: in accordance with a determination that one or more criteria are met, detect contact between the first body part and the second body part; and in accordance with a determination that the one or more criteria are not met, detect no contact between the first body part and the second body part. The one or more criteria can include a first criterion that is met when an amplitude of the sensed signal exceeds an amplitude threshold and a second criterion that is met when the sensed signal has a non-distorted waveform. Additionally or alternatively to one or more of the examples disclosed above, in some examples, the processing circuitry can be further configured to: in accordance with a determination that the first criteria is met and that the second criterion is not met, detecting proximity of the first body part to the second body part without contact between the first body part and the second body part. Additionally or alternatively to one or more of the examples disclosed above, in some examples, the system can further comprise: drive circuitry coupled to a drive electrode. The drive circuitry can be configured to apply the drive signal to the drive electrode, and the drive electrode can be configured to contact the first body part. Additionally or alternatively to one or more of the examples disclosed above, in some examples, determining whether the amplitude of the sensed signal exceeds the amplitude threshold can comprise identifying a peak in a frequency domain representation of the sensed signal and comparing the peak identified in the frequency domain with the amplitude threshold in the frequency domain. Additionally or alternatively to one or more of the examples disclosed above, in some examples, determining whether the sensed signal has a non-distorted waveform can comprise comparing a width of the peak identified in the frequency domain with a width threshold. In accordance with a determination that the width is below the width threshold, determining that the sensed signal has the non-distorted waveform; and in accordance with a determination that the width is above the width threshold, determining that the sensed signal has a distorted waveform. Additionally or alternatively to one or more of the examples disclosed above, in some examples, determining whether the sensed signal has a non-distorted waveform can comprise comparing an amplitude-normalized width of the peak identified in the frequency domain with a width threshold. In accordance with a determination that the amplitude-normalized width is below the width threshold, determining that the sensed signal has the non-distorted waveform; and in accordance with a determination that the amplitude-normalized width is above the width threshold, determining that the sensed signal has a distorted waveform. Additionally or alternatively to one or more of the examples disclosed above, in some examples, determining whether the received sensed has a non-distorted waveform can comprise identifying a second peak in the frequency domain representation of the sensed signal, the second peak at a lower frequency than the first peak, and comparing the second peak identified in the frequency domain with a second amplitude threshold in the frequency domain. In accordance with a determination that an amplitude of the second peak is below the second amplitude threshold, determining that the sensed signal has the non-distorted waveform; and in accordance with a determination that the amplitude of the second peak is above the second amplitude threshold, determining that the sensed signal has a distorted waveform. Additionally or alternatively to one or more of the examples disclosed above, in some examples, determining whether the sensed signal has a non-distorted waveform can comprise correlating the sensed signal with a reference signal. In accordance with a determination that the correlation is above a correlation threshold, determining that the sensed signal has the non-distorted waveform; and in accordance with a determination that the correlation is below the correlation threshold, determining that the sensed signal has a distorted waveform. Additionally or alternatively to one or more of the examples disclosed above, in some examples, the drive signal can have a frequency greater than 500 kHz or between 1-10 MHz. Additionally or alternatively to one or more of the examples disclosed above, in some examples, the drive signal can be a square wave. Additionally or alternatively to one or more of the examples disclosed above, in some examples, the first body part can comprise a first wrist and hand and the second body part can comprise a second wrist and hand. Additionally or alternatively to one or more of the examples disclosed above, in some examples, detecting contact between the first body part and the second body part can comprise detecting contact between a finger of a first hand and a palm or a finger of a second hand.

Some examples of the disclosure are directed to a method. The method can comprise: at a device comprising sense circuitry and processing circuitry: sensing, via sense circuitry, a signal at a sense electrode configured to contact a first body part, in response to a drive signal applied by a drive electrode configured to contact a second body part, different from the first body part; and in accordance with a determination that one or more criteria are met, detecting contact between the first body part and the second body part; and in accordance with a determination that the one or more criteria are not met, detecting no contact between the first body part and the second body part. The one or more criteria can include a first criterion that is met when an amplitude of the sensed signal exceeds an amplitude threshold and a second criterion that is met when the sensed signal has a non-distorted waveform. Additionally or alternatively to one or more of the examples disclosed above, in some examples, the method can further comprise: in accordance with a determination that the first criteria is met and that the second criterion is not met, detecting proximity of the first body part to the second body part without contact between the first body part and the second body part. Additionally or alternatively to one or more of the examples disclosed above, in some examples, determining whether the amplitude of the sensed signal exceeds the amplitude threshold can comprise identifying a peak in a frequency domain representation of the sensed signal and comparing the peak identified in the frequency domain with the amplitude threshold in the frequency domain. Additionally or alternatively to one or more of the examples disclosed above, in some examples, determining whether the sensed signal has a non-distorted waveform can comprise comparing a width of the peak identified in the frequency domain with a width threshold. In accordance with a determination that the width is below the width threshold, determining that the sensed signal has the non-distorted waveform; and in accordance with a determination that the width is above the width threshold, determining that the sensed signal has a distorted waveform. Additionally or alternatively to one or more of the examples disclosed above, in some examples, determining whether the sensed signal has a non-distorted waveform can comprise comparing an amplitude-normalized width of the peak identified in the frequency domain with a width threshold. In accordance with a determination that the amplitude-normalized width is below the width threshold, determining that the sensed signal has the non-distorted waveform; and in accordance with a determination that the amplitude-normalized width is above the width threshold, determining that the sensed signal has a distorted waveform. Additionally or alternatively to one or more of the examples disclosed above, in some examples, determining whether the received sensed has a non-distorted waveform can comprise identifying a second peak in the frequency domain representation of the sensed signal, the second peak at a lower frequency than the first peak, and comparing the second peak identified in the frequency domain with a second amplitude threshold in the frequency domain. In accordance with a determination that an amplitude of the second peak is below the second amplitude threshold, determining that the sensed signal has the non-distorted waveform; and in accordance with a determination that the amplitude of the second peak is above the second amplitude threshold, determining that the sensed signal has a distorted waveform. Additionally or alternatively to one or more of the examples disclosed above, in some examples, determining whether the sensed signal has a non-distorted waveform can comprise correlating the sensed signal with a reference signal. In accordance with a determination that the correlation is above a correlation threshold, determining that the sensed signal has the non-distorted waveform; and in accordance with a determination that the correlation is below the correlation threshold, determining that the sensed signal has a distorted waveform. Additionally or alternatively to one or more of the examples disclosed above, in some examples, the drive signal can have a frequency greater than 500 kHz or between 1-10 MHz. Additionally or alternatively to one or more of the examples disclosed above, in some examples, the drive signal can be a square wave. Additionally or alternatively to one or more of the examples disclosed above, in some examples, the first body part can comprise a first wrist and hand and the second body part can comprise a second wrist and hand. Additionally or alternatively to one or more of the examples disclosed above, in some examples, detecting contact between the first body part and the second body part can comprise detecting contact between a finger of a first hand and a palm or a finger of a second hand. Some examples of the disclosure are directed to a non-transitory computer readable storage medium. The non-transitory computer readable storage medium can store instructions (e.g., one or more programs), which when executed by one or more processors of an electronic device, can cause the electronic device to perform any of the above methods.

Some examples of the disclosure are directed to a system. The system can comprise sense circuitry and processing circuitry. The sense circuitry can be coupled to a sense electrode, the sense circuitry configured to sense a signal at the sense electrode in response to a drive signal applied to a first finger of a hand, and the sense electrode configured to contact a second finger of the hand, different from the first finger. The processing circuitry can be configured to: in accordance with a determination that one or more criteria are met, detect a movement gesture; and in accordance with a determination that the one or more criteria are not met, forgo detecting the movement gesture. The one or more criteria can include a first criterion indicative of contact between the first finger and the second finger and a second criterion indicative of movement of the first finger along the second finger. Additionally or alternatively to one or more of the examples disclosed above, in some examples, the first criterion can be met when an amplitude of the sensed signal exceeds an amplitude threshold. Additionally or alternatively to one or more of the examples disclosed above, in some examples, the first criterion can be met when an amplitude of the sensed signal exceeds an amplitude threshold and when the sensed signal has a non-distorted waveform. Additionally or alternatively to one or more of the examples disclosed above, in some examples, the second criterion can be met when an amplitude of the sensed signal increases or decreases by a threshold amount subsequent to and while the first criterion is met. Additionally or alternatively to one or more of the examples disclosed above, in some examples, the movement gesture can be a slide gesture. Additionally or alternatively to one or more of the examples disclosed above, in some examples, in accordance with a determination that an amplitude of the sensed signal increases from an initial value (by a threshold amount), the detected movement gesture can be a slide-toward gesture. Additionally or alternatively to one or more of the examples disclosed above, in some examples, in accordance with a determination that an amplitude of the sensed signal decreases from an initial value (by a threshold amount), the detected movement gesture can be a slide-away gesture. Additionally or alternatively to one or more of the examples disclosed above, in some examples, the first electrode can be configured to contact the first finger at or near the base of the first finger and the second electrode can be configured to contact the second finger at or near the base of the second finger. Additionally or alternatively to one or more of the examples disclosed above, in some examples, the first finger can be a thumb and the second finger can be an index finger. The first electrode can be configured to contact the first finger at or near the middle of the thumb, and the second electrode can be configured to contact the index finger at or near the base of the index finger.

Some examples of the disclosure are directed to a method. The method can comprise: at a device comprising sense circuitry and processing circuitry: sensing, via sense circuitry, a signal at a sense electrode in response to a drive signal applied by a drive electrode configured to contact a first finger of a hand, the sense electrode configured to contract a second finger of the hand, different from the first finger; and in accordance with a determination that one or more criteria are met, detect a movement gesture; and in accordance with a determination that the one or more criteria are not met, forgo detecting the movement gesture. The one or more criteria can include a first criterion indicative of contact between the first finger and the second finger and a second criterion indicative of movement of the first finger along the second finger. Additionally or alternatively to one or more of the examples disclosed above, in some examples, the first criterion can be met when an amplitude of the sensed signal exceeds an amplitude threshold. Additionally or alternatively to one or more of the examples disclosed above, in some examples, the first criterion can be met when an amplitude of the sensed signal exceeds an amplitude threshold and when the sensed signal has a non-distorted waveform. Additionally or alternatively to one or more of the examples disclosed above, in some examples, the second criterion can be met when an amplitude of the sensed signal increases or decreases by a threshold amount subsequent to and while the first criterion is met. Additionally or alternatively to one or more of the examples disclosed above, in some examples, the movement gesture can be a slide gesture. Additionally or alternatively to one or more of the examples disclosed above, in some examples, in accordance with a determination that an amplitude of the sensed signal increases from an initial value (by a threshold amount), the detected movement gesture can be a slide-toward gesture. Additionally or alternatively to one or more of the examples disclosed above, in some examples, in accordance with a determination that an amplitude of the sensed signal decreases from an initial value (by a threshold amount), the detected movement gesture can be a slide-away gesture. Additionally or alternatively to one or more of the examples disclosed above, in some examples, the first electrode can be configured to contact the first finger at or near the base of the first finger and the second electrode can be configured to contact the second finger at or near the base of the second finger. Additionally or alternatively to one or more of the examples disclosed above, in some examples, the first finger can be a thumb and the second finger can be an index finger. The first electrode can be configured to contact the first finger at or near the middle of the thumb, and the second electrode can be configured to contact the index finger at or near the base of the index finger. Some examples of the disclosure are directed to a non-transitory computer readable storage medium. The non-transitory computer readable storage medium can store instructions (e.g., one or more programs), which when executed by one or more processors of an electronic device, can cause the electronic device to perform any of the above methods.

Although examples of this disclosure have been fully described with reference to the accompanying drawings, it is to be noted that various changes and modifications will become apparent to those skilled in the art. Such changes and modifications are to be understood as being included within the scope of examples of this disclosure as defined by the appended claims.

The invention claimed is:

1. A system comprising:
   sense circuitry coupled to a sense electrode, the sense circuitry configured to sense a signal at the sense electrode in response to a drive signal applied to a first body part, and the sense electrode configured to contact a second body part, different from the first body part; and
   processing circuitry configured to:
      in accordance with a determination that one or more criteria are met, the one or more criteria including at least one criterion that involves a comparison with a frequency domain representation of the sensed signal, the one or more criteria including a first criterion that is met when an amplitude of the sensed signal exceeds an amplitude threshold and a second criterion that is met when the sensed signal has a non-distorted waveform, detecting contact between the first body part and the second body part; and
      in accordance with a determination that the one or more criteria are not met, detecting no contact between the first body part and the second body part.

2. The system of claim 1, the processing circuitry further configured to:
   in accordance with a determination that the first criterion is met and that the second criterion is not met, detecting proximity of the first body part to the second body part without contact between the first body part and the second body part.

3. The system of claim 1, further comprising:
   drive circuitry coupled to a drive electrode, the drive circuitry configured to apply the drive signal to the drive electrode, and the drive electrode configured to contact the first body part.

4. The system of claim 1, wherein determining whether the amplitude of the sensed signal exceeds the amplitude threshold comprises identifying a peak in the frequency domain representation of the sensed signal and comparing the peak identified in the frequency domain with the amplitude threshold in the frequency domain.

5. The system of claim 4, wherein determining whether the sensed signal has a non-distorted waveform comprises comparing a width of the peak identified in the frequency domain with a width threshold;
   in accordance with a determination that the width is below the width threshold, determining that the sensed signal has the non-distorted waveform; and
   in accordance with a determination that the width is above the width threshold, determining that the sensed signal has a distorted waveform.

6. The system of claim 4, wherein determining whether the sensed signal has a non-distorted waveform comprises comparing an amplitude-normalized width of the peak identified in the frequency domain with a width threshold;
   in accordance with a determination that the amplitude-normalized width is below the width threshold, determining that the sensed signal has the non-distorted waveform; and
   in accordance with a determination that the amplitude-normalized width is above the width threshold, determining that the sensed signal has a distorted waveform.

7. The system of claim 4, wherein the peak in the frequency domain representation of the sensed signal comprises a first peak, wherein determining whether the sensed signal has a non-distorted waveform comprises identifying a second peak in the frequency domain representation of the sensed signal, the second peak at a lower frequency than the first peak, and comparing the second peak identified in the frequency domain with a second amplitude threshold in the frequency domain;
   in accordance with a determination that an amplitude of the second peak is below the second amplitude threshold, determining that the sensed signal has the non-distorted waveform; and
   in accordance with a determination that the amplitude of the second peak is above the second amplitude threshold, determining that the sensed signal has a distorted waveform.

8. The system of claim 1, wherein determining whether the sensed signal has a non-distorted waveform comprises correlating the sensed signal with a reference signal;
   in accordance with a determination that the correlation is above a correlation threshold, determining that the sensed signal has the non-distorted waveform; and
   in accordance with a determination that the correlation is below the correlation threshold, determining that the sensed signal has a distorted waveform.

9. The system of claim 1, wherein the drive signal has a frequency greater than 1 MHz.

10. The system of claim 1, wherein the drive signal is a square wave.

11. The system of claim 1, wherein the first body part comprises a first wrist and hand and the second body part comprises a second wrist and hand.

12. The system of claim 1, wherein detecting contact between the first body part and the second body part comprises detecting contact between a finger of a first hand and a palm or a finger of a second hand.

13. A method comprising:
   at a device comprising sense circuitry and processing circuitry:
      sensing, via sense circuitry, a signal at a sense electrode configured to contact a first body part, in response to a drive signal applied by a drive electrode configured to contact a second body part, different from the first body part; and
   in accordance with a determination that one or more criteria are met, the one or more criteria including at least one criterion that involves a comparison with a frequency domain representation of the sensed signal, the one or more criteria including a first criterion that is met when an amplitude of the sensed signal exceeds an amplitude threshold and a second criterion that is met when the sensed signal has a non-distorted waveform, detecting contact between the first body part and the second body part; and
   in accordance with a determination that the one or more criteria are not met, detecting no contact between the first body part and the second body part.

14. A system comprising:
   sense circuitry coupled to a sense electrode, the sense circuitry configured to sense a signal at the sense electrode in response to a drive signal applied to a first finger of a hand, and the sense electrode configured to contact a second finger of the hand, different from the first finger; and
   processing circuitry configured to:
      in accordance with a determination that one or more criteria are met, the one or more criteria including a first criterion indicative of contact between the first finger and the second finger and a second criterion indicative of movement of the first finger along the second finger, detecting a movement gesture; and
      in accordance with a determination that the one or more criteria are not met, forgo detecting the movement gesture.

15. The system of claim 14, wherein the first criterion is met when an amplitude of the sensed signal exceeds an amplitude threshold.

16. The system of claim 14, wherein the first criterion is met when an amplitude of the sensed signal exceeds an amplitude threshold and that is met when the sensed signal has a non-distorted waveform.

17. The system of claim 14, wherein the second criterion is met when an amplitude of the sensed signal increases or decreases by a threshold amount subsequent to and while the first criterion is met.

18. The system of claim 14, wherein the movement gesture is a slide gesture.

19. The system of claim 18, wherein in accordance with a determination that an amplitude of the sensed signal increases from an initial value, the detected movement gesture is a slide-toward gesture.

20. The system of claim 18, wherein in accordance with a determination that an amplitude of the sensed signal decreases from an initial value, the detected movement gesture is a slide-away gesture.

21. The system of claim 14, further comprising drive circuitry coupled to a drive electrode, wherein the drive electrode is configured to contact the first finger at or near a base of the first finger and wherein the sense electrode is configured to contact the second finger at or near the base of the second finger.

22. The system of claim 14, further comprising drive circuitry coupled to a drive electrode, wherein the first finger is a thumb and the second finger is an index finger, wherein the drive electrode is configured to contact the first finger at or near a middle of the thumb, and wherein the sense electrode is configured to contact the index finger at or near a base of the index finger.

* * * * *